US010873027B2

(12) United States Patent
Martin

(10) Patent No.: US 10,873,027 B2
(45) Date of Patent: Dec. 22, 2020

(54) PROCESS FOR THE MANUFACTURE OF A MULTILAYER STRUCTURE

(71) Applicant: NISSAN CHEMICAL INDUSTRIES, LTD., Tokyo (JP)

(72) Inventor: Roland Martin, Zaventem (BE)

(73) Assignee: Nissan Chemical Industries, Ltd., Tokyo (JP)

( * ) Notice: Subject to any disclaimer, the term of this patent is extended or adjusted under 35 U.S.C. 154(b) by 312 days.

(21) Appl. No.: 14/101,817

(22) Filed: Dec. 10, 2013

(65) Prior Publication Data
US 2014/0159013 A1 Jun. 12, 2014

(30) Foreign Application Priority Data

Dec. 11, 2012 (EP) .................................... 12196515

(51) Int. Cl.
*H01L 51/50* (2006.01)
*H01L 51/56* (2006.01)
*H01L 51/00* (2006.01)

(52) U.S. Cl.
CPC ...... *H01L 51/0007* (2013.01); *H01L 51/0003* (2013.01); *H01L 51/56* (2013.01); *H01L 51/0035* (2013.01); *H01L 51/0059* (2013.01); *Y02E 10/549* (2013.01); *Y02P 70/50* (2015.11)

(58) Field of Classification Search
CPC ....... H01L 51/0001–0007; H01L 51/56; H01L 51/0035; H01L 51/0059; H01L 51/50; Y02P 70/521; Y02E 10/549
USPC ........... 427/379, 384, 385.5, 58, 66; 257/40, 257/88–104, E51.001–E51.052; 428/690, 428/691, 917; 313/500–512; 252/301.16–301.35
See application file for complete search history.

(56) References Cited

U.S. PATENT DOCUMENTS

| | | | | |
|---|---|---|---|---|
| 6,476,184 | B1* | 11/2002 | Janietz | C08G 73/08 528/288 |
| 7,911,129 | B2 | 3/2011 | Hofmann | |
| 2001/0012045 | A1* | 8/2001 | Goto | B41M 5/30 347/187 |
| 2001/0026878 | A1* | 10/2001 | Woo | C07C 25/22 428/690 |
| 2003/0008972 | A1* | 1/2003 | Kato | C08F 2/20 525/56 |
| 2003/0080677 | A1* | 5/2003 | Mikhael | C23C 14/12 313/504 |
| 2004/0013905 | A1* | 1/2004 | Tsuboyama | C09K 11/06 428/690 |
| 2004/0212042 | A1* | 10/2004 | Sagisaka | C08G 61/12 257/552 |
| 2005/0106324 | A1 | 5/2005 | Dibbs | |
| 2005/0186445 | A1* | 8/2005 | Zheng | C08G 61/02 428/690 |
| 2005/0187364 | A1* | 8/2005 | Herron | H01L 51/004 526/310 |
| 2006/0222758 | A1* | 10/2006 | Taka | C09K 11/06 427/66 |
| 2006/0250076 | A1* | 11/2006 | Hofmann | H01L 51/002 313/504 |
| 2009/0217980 | A1* | 9/2009 | Pfeiffer | B82Y 10/00 136/263 |
| 2010/0148663 | A1* | 6/2010 | Tsai | H01L 51/0085 540/465 |
| 2011/0006288 | A1* | 1/2011 | Katayama | H01L 51/5012 257/40 |
| 2012/0032104 | A1* | 2/2012 | Amb | H01B 1/122 252/62.2 |
| 2012/0267619 | A1* | 10/2012 | Yamada | H01L 51/5004 257/40 |

OTHER PUBLICATIONS

Wu et al., "Highly Efficient Light-Emitting Diodes Based on Fluorene Copolymer Consisting of Triarylamine Units in the Main Chain and Oxadiazole Pendent Groups", Macromolecules, 2005, vol. 38, pp. 9028-9036. (Year: 2005).*
Gu et al., "Triphenylamine-based pH chemosensor: Synthesis, crystal structure, photophysical properties and computational studies", Synthetic Metals, 2009, vol. 159, pp. 2497-2501. (Year: 2009).*
Chao Cai; Shi-Jian Su; Takayuki Chiba; Hisahiro Sasabe; Yong-Jin Pu; Kenichi Nakayama; Junji Kido—High-efficiency red, green and blue phosphorescent homojunction organic light-emitting diodes based on bipolar host materials—Organic Electronics (2011) vol. 12, Issue 5, pp. 843-850—DOI: 10.1016/j.orgel.2011.01.021.
K. Harada, A. G. Werner, M. Pfeiffer, C. J. Bloom, C. M. Elliott, and K. Leo—Organic Homojunction Diodes with a High Built-in Potential: Interpretation of the Current-Voltage Characteristics by a Generalized Einstein Relation—Phys. Rev. Lett. 94, 036601—Published Jan. 24, 2005—DOI: 10.1103/PhysRevLett.94.036601.
Kentaro Harada, Moritz Riede, Karl Leo, Olaf R. Hild, and C. Michael Elliott—Pentacene homojunctions: Electron and hole transport properties and related photovoltaic responses—Phys. Rev. B 77, 195212—Published May 28, 2008—DOI: 10.1103/PhysRevB. 77.195212.
Carlos A. Zuniga, Stephen Barlow, Seth R. Marder—Approaches to Solution-Processed Multilayer Organic Light-Emitting Diodes Based on Cross-Linking—Chem. Mater., 2011, 23 (3), pp. 658-681—DOI: 10.1021/cm102401k.
Louis M. Leung, Yik-Chung Law, Michael Y. Wong, Lok-Yee Tang—Color tunable conductive vinyl copolymers for OLED applications—Proc. SPIE 6828, Light-Emitting Diode Materials and Devices II, 68280D (Nov. 20, 2007)—doi: 10.1117/12.752059.

(Continued)

*Primary Examiner* — Dylan C Kershner
(74) *Attorney, Agent, or Firm* — The Marbury Law Group, PLLC

(57) ABSTRACT

A process for the manufacture of a multilayer structure suitable for forming part of an organic electronic device having a cathode and an anode wherein liquid compositions with solvent systems comprising organic compounds with ionizable groups are deposited out of solution. Organic electronic devices can be made with use of the process including transistors, diodes, and photovoltaic devices, including organic light emitting diodes (OLEDs).

15 Claims, No Drawings

(56) References Cited

OTHER PUBLICATIONS

Guey-Kai Ho, Hsin-Fei Meng, Shi-Chang Lin, Sheng-Fu Horng, Chain-Shu Hsu, Lai-Cheng Chen, Shu-Mei Chang—Efficient white light emission in conjugated polymer homojunctions—Appl. Phys. Lett. 85, 4576 (2004)—DOI: 10.1063/1.1813643.

Taeshik Earmme, Eilaf Ahmed, Samson A. Jenekhe—Solution-Processed Highly Efficient Blue Phosphorescent Polymer Light-Emitting Diodes Enabled by a New Electron Transport Material—Advanced Materials (2010) vol. 22, Issue 42, pp. 4744-4748—DOI: 10.1002/adma.201001585.

Taeshik Earmme, Samson A. Jenekhe—High-performance multilayered phosphorescent OLEDs by solution-processed commercial electron-transport materials—J. Mater. Chem., 2012,22, 4660-4668—DOI: 10.1039/C2JM14347J.

"K. Walzer, B. Maennig, M. Pfeiffer, K. Leo—Highly Efficient Organic Devices Based on Electrically Doped Transport Layers—Chem. Rev., 2007, 107 (4), pp. 1233-1271 DOI: 10.1021/cr050156n".

Hayato Tsuji, Chikahiko Mitsui, Yoshiharu Sato, Eiichi Nakamura—Bis(carbazolyl)benzodifuran: A High-Mobility Ambipolar Material for Homojunction Organic Light-Emitting Diode Devices—Advanced Materials (2009) vol. 21, Issue 37, pp. 3776-3779—DOI: 10.1002/adma.200900634.

"Selina Olthof, Hans Kleemann, Björn Lüssem, Karl Leo—Built-in potential of a pentacene p-i-n homojunction studied by ultraviolet photoemission spectroscopy—Mater. Res. Soc. Symp. Proc. vol. 1270 © 2010 Materials Research Society (1270-II09-49)".

Qiang Wang, Youtan Tao, Xianfeng Qiao, Jiangshan Chen, Dongge Ma, Chuluo Yang, Jingui Qin—High-Performance, Phosphorescent, Top-Emitting Organic Light-Emitting Diodes with p-i-n Homojunctions—Advanced Functional Materials (2011) vol. 21, Issue 9, pp. 1681-1686—DOI: 10.1002/adfm.201002229.

S. Hamwi, T. Riedl, W. Kowalsky—An organic p-i-n homojunction as ultra violet light emitting diode and visible-blind photodiode in one—Appl. Phys. Lett. (2011) 99, 053301—DOI: 10.1063/1.3617427.

\* cited by examiner

PROCESS FOR THE MANUFACTURE OF A MULTILAYER STRUCTURE

This application claims priority to European Application No. 12196515, filed on Dec. 11, 2012, the entirety of which is being incorporated herein by reference for all purposes.

The present invention relates to a process for the manufacture of a multilayer structure suitable for forming part of an organic electronic device having a cathode and an anode.

Today various organic electronic devices are under active study and development, in particular optoelectronic devices based on electroluminescence (EL) from organic materials.

In contrast to photoluminescence, i.e. the light emission from an active material as a consequence of optical absorption and relaxation by radiative decay of an excited state, electroluminescence (EL) is a non-thermal generation of light resulting from the application of an electric field to a substrate. In this latter case, excitation is accomplished by recombination of charge carriers of contrary signs (electrons and holes) injected into an organic semiconductor in the presence of an external circuit.

A simple prototype of an organic light-emitting diode (OLED), i.e. a single layer OLED, is typically composed of a thin film of an active organic material which is sandwiched between two electrodes, one of which needs to have a degree of transparency sufficient in order to observe light emission from the organic layer.

If an external voltage is applied to the two electrodes, charge carriers, i.e. holes at the anode and electrons at the cathode, are injected to the organic layer beyond a specific threshold voltage depending on the organic material applied. In the presence of an electric field, charge carriers move through the active layer and are non-radiatively discharged when they reach the oppositely charged electrode. However, if a hole and an electron encounter one another while drifting through the organic layer, excited singlet (anti-symmetric) and triplet (symmetric) states, so-called excitons, are formed. For every three triplet excitons that are formed by electrical excitation in an OLED, one anti-symmetric state (singlet) exciton is created. Light is thus generated in the organic material from the decay of molecular excited states (or excitons) according to a radiative recombination process known as either fluorescence for which spin symmetry is preserved, or phosphorescence when luminescence from both singlet and triplet excitons can be harvested.

High efficiency OLEDs based on small molecules usually comprise a multiplicity of different layers, each layer being optimized towards achieving the optimum efficiency of the overall device.

Typically such OLEDs comprise a multilayer structure comprising multiple layers serving different purposes. Devices generally referred to as p-i-n OLED comprise typically at least five layers: a p-doped transport layer (also referred to as hole injection layer or HIL), an usually undoped hole transport layer (HTL), at least one emissive layer (EML), an usually undoped electron transport layer (ETL) and a doped electron injection layer (EIL).

In order to achieve an optimum efficiency, the physical properties of each material for each individual layer of the stack (as e.g. carrier transport properties, HOMO and LUMO levels, singlet and triplet energy levels) have to be selected properly depending on the functionality of the layer. As a result thereof, chemical composition and molecular structure of the materials usually differ from each other and the OLED stack of such a device is referred to as a heterojunction device.

Until today, multilayer OLEDS have frequently been prepared by vacuum deposition technologies whereby the layers are consecutively deposited on each other from the gas phase. In vacuum evaporation processes organic molecules are heated, evaporated and then condensed onto the substrate. A mask has to be used to pattern an organic layer for the actual pixels which makes the method relatively inefficient and expensive as most of the evaporated material is wasted (it does not end up on the substrate at the targeted position). Furthermore, vacuum deposition methods are in general not suitable for high molecular weight compounds which are difficult to vaporize without decomposition.

In accordance with the organic vapour jet deposition method, the organic materials are transported to the substrate with a carrier gas, which makes this process more efficient than the vacuum evaporation process, but there is still improvement in efficiency and economics desirable.

For OLEDs manufactured by vacuum technologies (deposition from the gas phase) so called homojunction-type OLEDs have been described in the literature. Such devices are characterized by the fact that the number of different matrix materials used for the different layers is lower than the number of layers, i.e. at least two of the layers have the same matrix material. In an ideal homojunction device, all the matrix materials are identical or at least very similar in molecular properties and structure.

Multilayer systems of the homojunction type are particularly difficult to obtain when the materials are processed from solution because deposition of one layer on the preceding layer suffers from various interactions and interferences which deteriorate device performance. Technologies like cross-linking of a layer prior to deposition of the next layer have been developed in this regard.

Orthogonal solvent processing techniques for homojunction type devices (using different solvent systems for the deposition of subsequent layers where the solvent systems for a subsequent layer do not affect the previously deposited layer) have been developed for heterojunction devices but it is apparent that these methods are not directly applicable for homojunction type devices as there are no "orthogonal solvents" if the same material is deposited.

U.S. Pat. No. 7,911,129 relates to an organic p-i-n type light emitting diode with a stack of layers between two electrodes wherein the overall number of matrix materials for the layers is smaller than the number of layers of the stack. The different layers are deposited by vacuum technologies, i.e. from the gas phase.

Cai et al., Organic Electronics 12, 843 (2011) describe high-efficiency phosphorescent homojunction organic light emitting diodes comprising ambipolar host materials based on carbazolyl phenyl pyridines or pyrimidines. The consecutive layers of the stack are deposited from the gas phase.

Harada et al. Phys. Rev. Lett., 94, 036601 (2005) describes organic homojunction diodes with a high built in potential where the various layers are deposited from the gas phase.

Harada et al., Phys. Review 77, 195212 (2008) report on pentacene homojunctions and their electron and hole transport properties. The difficulties in the realization of organic homojunctions are described and are seen in the establishing of an efficient charge transfer between the dopant used and the matrix. p- and n-type conductivity has to be established in the same matrix material. The process used for manufacturing of the devices is a vapour deposition process.

Zuniga et al, Chem. Mater. 2011, 23, 658-681 discuss approaches to solution processed multilayer organic light emitting diodes based on cross-linking. No homojunction type devices are reported.

OLED devices based on polymeric molecules (sometimes also referred to as PLED) have also been described in the literature. As these high molecular weight molecules are difficult if not impossible to vaporize, solution technologies have been described for their manufacture.

Leung et al., Proc. of SPIE, Vol. 6828, 68280D (2007) report on experiments with colour tunable vinyl copolymers for OLED applications. According to the abstract, OLEDs based on the investigated polymers have been prepared by spin coating from a solution of the copolymers in trichloromethane.

Ho et al, Appl. Phys. Lett. 85, 4576 (2004) describe conjugated polymer homojunction devices with efficient white light emission which are prepared by solution processing.

Jenekhe et al., Adv. Materials 2010, 22, 4744-4748 describe the formation of highly efficient polymer based blue PhOLEDs fabricated by sequential solution processing using mixtures of formic acid and water for the deposition of 1,3,5-tris(4-phenylquinoline-2-yl)benzene layers onto polymeric layers based on poly(vinyl carbazoles) The devices are of the heterojunction type.

A similar process is described in Jenekhe et al., J. Mater. Chem. 2012, 22, 4660-4668, wherein high performance OLEDs are obtained by solution processing commercial electron transport materials with mixtures of formic acid and water for deposition of said materials onto polymeric layers based on poly (vinyl carbazoles). The devices are thus of the heterojunction type.

There still exists a need for solution based processes for the manufacture of organic electronic devices having at least one homojunction between two subsequent layers.

Accordingly it was an object of the present invention to provide a solution-based process for the manufacture of multilayer structures suitable for forming part of an organic electronic device which devices preferably have at least one homojunction between two adjacent layers.

This object has been achieved with a process as claimed in claim 1.

Preferred embodiments of the process in accordance with the present invention are set forth in the dependent claims and in the detailed specification hereinafter.

Further aspects of the invention relate to organic electronic devises having a multilayer structure comprising at least two adjacent layers obtained by the process in accordance with the process of the present invention and the use of the process of the present invention in the manufacture of organic electronic devices having a multilayer structure.

The present invention provides a process for the manufacture of a multilayer structure suitable for forming part of an organic electronic device having a cathode and an anode, comprising the steps of a. depositing a $n^{th}$ layer $L_n$ of the multilayer structure onto a substrate out of a liquid composition $C_n$ comprising a solvent system $S_n$ comprising at least one solvent and at least one organic compound $M_i$ which comprises ionizable groups G mainly or totally in neutral ($G_n$) or mainly or totally in ionized ($G_i$) form, wherein the substrate is a previously deposited layer $L_{n-1}$ of the multilayer structure or is an element suitable for forming the cathode or the anode of the organic electronic device, and thereafter either b1.1 evaporating the solvent system $S_n$ and, if the organic compound $M_i$ comprises the group G mainly or totally in its ionized form $G_i$, converting partly or completely the groups $G_i$ to the neutral form $G_n$, and b1.2 thereafter depositing a $(n+1)^{th}$ layer $L_{n+1}$ of the multilayer structure onto the first layer $L_n$ out of a liquid composition $C_{n+1}$ comprising a solvent system $S_{n+1}$, and organic compound $M_i$ comprising the ionizable group G mainly or totally in ionized form $G_i$ and thereafter b1.3. evaporating the solvent system $S_{n+1}$ to form the dry $n^{th}$ layer and converting the groups $G_{i\ to}$ form the dry $(n+1)^{th}$ layer mainly or totally to the neutral form $G_n$, or, b2.1. evaporating the solvent system $S_n$ to form the dry $n^{th}$ layer $L_n$ comprising groups G mainly or totally in ionized form $G_i$ and thereafter b2.2. depositing the $(n+1)^{th}$ layer $L_{n+1}$ of the multilayer structure onto the dry $n^{th}$ layer $L_n$ out of a liquid composition $C_{(n+1)'}$ comprising a solvent system $S_{(n+1)'}$ comprising organic compound $M_i$ comprising ionizable groups G mainly or totally in the neutral form $G_n$ and evaporating the solvent system $S_{(n+1)'}$ to form a dry $(n+1)^{th}$ layer mainly or totally in the neutral form $G_n$ and thereafter either b3.1 depositing a $(n+2)^{th}$ layer out of a liquid composition $C_{(n+2)}$ comprising a solvent system $S_{(n+2)}$ comprising organic compound $M_i$ comprising groups G mainly or totally in the ionized form $G_i$ followed by converting the groups $G_i$ in the dry $n^{th}$ and the dry $(n+2)^{th}$ layer mainly or totally to the neutral form $G_n$, or b3.2 directly converting the groups $G_i$ in the $n^{th}$ layer mainly or totally to the neutral form wherein the solubility of organic compound $M_i$ comprising groups G mainly or totally in ionized form $G_i$ in solvent system $S_{n+1}$ and $S_{n+2}$, which may be the same or different, is at least three times as high as the solubility of organic compounds $M_i$ comprising groups G mainly or totally in neutral form $G_n$ in said solvent system $S_{n+1}$ and $S_{n+2}$ and wherein the solubility of organic compounds $M_i$ comprising groups G mainly or totally in neutral form $G_n$ in solvent system $S_{(n+1)'}$ is at least three times as high as the solubility of organic compound $M_i$ comprising groups G mainly or totally in ionized form $G_i$ in said solvent system $S_{(n+1)'}$, the solubility in all cases determined at 23° C. and atmospheric pressure.

In accordance with a preferred embodiment of the process of the present invention the ratio of solubility of the two different forms of organic compound Mi referred to above is at least five, even more preferably at least nine.

In the first step a of the process of the present invention, a layer n (the $n^{th}$) layer of a multilayer structure is deposited onto a substrate which substrate may be a previously deposited layer of the said multilayer structure or an element suitable for forming the cathode or the anode of the organic electronic device. Accordingly, the layer deposited in the first step may be a layer directly adjacent to one of the electrodes of the organic electronic device or it may be a layer not being in contact with one of the electrodes of the device.

The layer in the first step a is deposited out of a liquid composition $C_n$ comprising a solvent system $S_n$ and at least one organic compound $M_i$ and which comprises ionizable groups G mainly or totally in neutral ($G_n$) or mainly or totally in ionized form ($G_i$).

After the deposition in the first step a, the subsequent steps which are denoted as steps b1 and b2 respectively, depend on the nature of the groups G deposited in step a.

If step a is followed by step b1, the second layer to be deposited onto the layer obtained in the first step a is obtained from a liquid composition comprising organic compound $M_i$ with groups G mainly or totally in ionized form $G_i$. If the layer deposited in step a was also obtained from a liquid composition comprising organic compound $M_i$ with ionizable groups G partly or totally in ionized form $G_i$, a neutralization step to partly or fully convert the ionized groups in the layer obtained in step a (the $n^{th}$ layer) to the neutral form is necessary prior to the deposition in step b1.2 to avoid layer redissolution and the problems associated therewith.

This intermediate neutralization step is not necessary if the layer deposited in step a is obtained from organic compound $M_i$ with groups G mainly or totally in the neutral form $G_n$, i.e. the layer obtained in step a comprises groups G mainly or totally in the neutral form.

The deposition in step b1.2 is carried out from a liquid composition $C_{n+1}$ comprising a solvent system $S_{n+1}$ comprising organic compound $M_i$ comprising the ionizable groups G mainly or totally in the ionized form, i.e. the layer obtained in step b1.2. comprises the groups G mainly or totally in ionized form.

After deposition in step b1.2. the solvent system is evaporated in step 1.3. and the groups $G_i$ in the layer are mainly or totally converted to neutral groups $G_n$.

Alternatively, if step a is followed by the second alternative of the process in accordance with the present invention, the solvent system $S_n$ is evaporated in step b2.1 to obtain a substantially dry $n^{th}$ layer with groups G mainly or totally in ionized form $G_i$ and subsequently layer n+1 (the $(n+1)^{th}$ layer) is deposited out of a liquid composition $C_{(n+1)'}$ comprising a solvent system $S_{(n+1)'}$ comprising organic compound $M_i$ comprising ionizable groups G mainly or totally in the neutral form $G_n$ and evaporating the solvent system $S_{(n+1)'}$ to form a substantially dry $(n+1)^{th}$ layer.

Following step b2.2. either a $(n+2)^{th}$ layer may be deposited which comprises groups G mainly or totally in the ionized form $G_i$ and thereafter the ionized groups $G_i$ in the dry $n^{th}$ layer and in the $(n+2)^{th}$ layer are mainly or totally converted into the neutral form $G_n$ in step b3.1, or, after step b2.2., the ionized groups $G_i$ in the $n^{th}$ layer are converted mainly or totally to the neutral form $G_n$ in step b3.2.

When used herein, the term mainly is intended to denote that more than 50% of the respective groups are present in the respective form or are converted into the respective form. Thus, "mainly in ionized form" means that more than fifty percent of the groups G are in ionized form. Preferably, mainly denotes that more than 60, even more preferably more than 80 and most preferably more than 90% of the respective groups G are present in or converted into the respective form.

Organic compound $M_i$ comprising ionizable groups G mainly or totally in neutral or ionized form, forms part of the liquid composition of all the deposition steps in accordance with the present invention, i.e. it is part of liquid compositions $C_n$, $C_{n+1}$, $C_{n+2}$, and $C_{(n+1)'}$. $M_i$ preferably constitutes the major part of the materials suitable as matrix materials for the layers of the multilayer structure, more preferably it constitutes more than 60, even more preferably more than 80 wt % of the materials comprised in the respective liquid composition suitable as matrix materials for the layers of the multilayer structure. Most preferably, $M_i$ is the only material suitable as matrix materials in the respective liquid composition.

If other organic compounds which may serve the function as matrix materials of one or more layers of the multilayer structure are present in the liquid compositions of one or more of the steps of the process of the present invention, the percentage thereof, relative to the total amount of compounds suitable as matrix materials present in the liquid composition is preferably less than 50, more preferably less than 40 and even more preferably less than 20 wt %.

The structure of compounds with ionizable groups G suitable for use in the process of the present invention may be selected from any compound, either of low-molecular weight or of high molecular weight which may be reversibly ionized, preferably reversibly protonated under conditions which can be applied without deteriorating the structure of the layer or the integrity of the device comprising the layers obtained in accordance with the process of the present invention.

Generally said compounds comprising heteroatoms like nitrogen, oxygen, sulfur or phosphorus may be selected as these heteroatoms often can be ionized (protonated) under the conditions which can be applied in the process of the present invention.

Preferred compounds $M_i$ are compounds wherein the ionizable group G comprises at least one nitrogen atom capable of being reversibly protonated. Capable of being reversibly protonated, for the purpose of the present invention, is intended to denote compounds wherein the ionized protonated form can be converted to the neutral form under conditions which are not detrimental to the structure and integrity of the layer in which those groups are present.

In accordance with a preferred embodiment of the present invention, ionizable group G in organic compound $M_i$ is protonated through the use of one or more acids $H_{ai}A_i^{ai-}$ selected from proton acids having a pKa of 5.5 or less, preferably 5.0 or less and a boiling point under atmospheric pressure in the range of from 70 to 160° C., preferably in the range of from 80 to 140° C. As a result of the protonation, salts of general formula $Mi(H^+)_{ni}(A_i^{ai-})_{bi}$ are obtained wherein ni represents the number of protons per compound Mi and $A_i$ is a counter anion with negative charge ai and ni equals the product of ai times bi.

In accordance with a preferred embodiment of the present invention the number of protons per compound $M_i$ is less or equal to the number of nitrogen atoms in organic compound $M_i$.

Preferred organic compounds $M_i$ comprise at least one group G selected from 5- or 6-membered heterocyclic rings comprising at least one nitrogen atom, e.g. aryl amine, carbazole, acridine, phenothiazine and phenoxazine derivatives.

When used herein, the term arylamine derivative generally denotes a structural element where aryl groups are attached to one or more nitrogen atoms.

Generally, an arylamine derivative can be depicted as $NAr^1Ar^2Ar^3$ wherein $Ar^1$, $Ar^2$ and $Ar^3$, which may be the same or different, represent a substituted or unsubstituted $C_5$ to $C_{30}$ aryl- or a substituted or unsubstituted $C_2$ to $C_{30}$ hetereoaryl group. Preferred examples of aryl groups are phenyl, naphthyl and anthracenyl, especially phenyl or naphthyl. Preferred heteroaryl groups are five or six membered heteroaryl compounds comprising at least one heteroatom, preferably selected from O, N and S, particularly preferred the heteroaryl ring contains at least one nitrogen atom.

A first preferred class of arylamine derivatives is represented by compounds of general formula

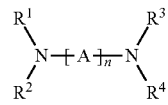

wherein A can have the same meaning as $Ar^1$ defined above; preferably A is selected from the group consisting of substituted or unsubstituted 5 to 7 membered aryl or heteroaryl rings, n is 1, 2 or 3 and $R^1$ to $R^4$, independent of one another, are unsubstituted or substituted $C_5$ to $C_{30}$ aryl or $C_2$ to $C_{30}$ heteroaryl rings as defined before for $Ar^1$.

Particularly preferred organic compounds $M_i$ comprise 5- or 6-membered heterocyclic rings comprising at least one nitrogen atom, selected from pyrrole, pyrazole, imidazole, oxazole, oxadiazole, triazole, indole, iso-indole, pyridine, pyridazine, pyrimidine, pyrazine, triazine, tetrazine, quinoline, iso-quinoline and phenanthroline.

In accordance with a further preferred embodiment of the present invention compound $M_i$ comprises a conjugated or non-conjugated polymer having a number average molecular weight of at least 5000 g/mol or a lower molecular weight compound which has a molecular weight of 2000 g/mol or less.

The nitrogen atom which is capable of being reversibly protonated in polymeric organic compounds $M_i$ may be part of a repeating unit of the conjugated or non-conjugated polymer chain or it may be part of a substituent attached to such repeating unit.

Organic compound $M_i$ may comprise more than one nitrogen atom capable of being reversibly protonated and selected from the groups referred to herein above.

The solvent systems in that various deposition steps comprise one or more solvents. Depending on the form in which ionizable group G is present in organic compound $M_i$ during that deposition step, the solvent or solvents comprised in the solvent system would be selected by the skilled person.

If ionizable groups G are present mainly or totally in ionized form $G_i$, polar solvents constitute the major part of the respective solvent system; if ionizable groups G are present mainly or totally in neutral form $G_n$, non-polar solvents are preferred.

Solvents are broadly classified into the two categories polar and non-polar. The dielectric constant of the respective solvents provides a rough measure of a solvent's polarity. Solvents with a dielectric constant of less than 15 are generally considered to be non-polar. Technically, the dielectric constant measures the solvent's ability to reduce the field strength of the electric field surrounding a charged particle immersed in it. This reduction is then compared to the field strength of the charged particle in a vacuum.

The polarity of a solvent determines what type of compounds it is able to solvate and eventually dissolve and with which other solvents or liquid compounds it will be more or less miscible.

Within the group of polar solvents usually a division is further made into protic and aprotic solvents. Polar protic solvents solvate compounds via strong hydrogen bonding and possibly proton transfer. Polar aprotic solvents tend to have large dipole moments enabling solvation via strong interactions with polar or charged species.

Non-limiting examples of non-polar solvents are aliphatic or aromatic hydrocarbons such as pentane, cyclopentane, hexane, cyclohexane, benzene and toluene to name only a few examples. Dioxane, trichloromethane and diethyl ether are examples of non-polar solvents comprising heteroatoms.

Examples of polar aprotic solvents are dichloromethane, tetrahydrofurane, ethyl acetate, acetone, dimethyl formamide, acetonitrile, dimethylsulfoxide and propylene carbonate, to give some representative examples.

Lower alkanols such as methanol, ethanol, propanol, isopropanol, and butanol or carboxylic acids like formic acid and acetic acid or water are often referred to as polar protic solvents.

If the organic compound $M_i$ comprises groups G mainly or totally in ionized form $G_i$ the solvent system preferably comprises at least one polar protic solvent. Particularly preferred are proton acids $H_{ai}A_i^{ai-}$, water and/or a $C_1$ to $C_3$ alcohol or mixtures thereof, i.e. the solvent system in this case preferably comprises the proton acid used for reversibly protonating organic compound $M_i$. The percentages of the components of the solvent system are not particularly critical and can be selected over a broad range in accordance with specific compound $M_i$ to achieve a sufficient solubility thereof in the solvent system for solvent processing, i.e. deposition out of the liquid phase.

Preferred proton acids are carboxylic acids, preferably selected from formic acid, acetic acid, 2-propenoic acid, 2-propynoic acid, lactic acid, maleic acid, trifluoroacetic acid, trifluoropropanoic acid, trifluorobutanoic acid or mixtures thereof.

The proton acid in the solvent system, if present, may constitute the major component of the respective solvent system, but it is also possible to use the respective acid as a component constituting less than 50 weight percent of the respective solvent system as long as the concentration is sufficient to mainly or totally protonate the nitrogen atoms in compound $M_i$ which are capable of being reversibly protonated.

If the layer deposited comprises ionizable groups G in the neutral form $G_n$, the solvents in the solvent system are preferably selected from non-polar solvents as mentioned above.

The skilled person will select the exact composition of the solvent system based on his professional knowledge and experience, the nature of compound $M_i$ and the individual application case.

The conversion of groups G in ionized form $G_i$ to the neutral form $G_n$ may be carried out through a variety of methods which are principally known to the skilled person and described in the prior art. Accordingly, there is no detailed information necessary here.

In accordance with a preferred embodiment of the process of the present invention the conversion of groups G in ionized form $G_i$ to the neutral form $G_n$ is achieved by subjecting the respective layer comprising groups G in ionized form to elevated temperatures up to a maximum of 180° C., preferably up to a maximum of 160° C. The time of treatment is not particularly critical and will be selected by the skilled person depending on the structure of group G in ionized form. Treatment times in the range of from three minutes up to six hours, preferably of from five minutes up to three hours have been found to be suitable in a significant number of cases.

The evaporation of the solvent system serves the purpose to substantially completely remove any solvent from the layer deposited and thereby obtaining a substantially and even more preferably completely dry layer before deposition of the next layer. This is of importance for obtaining the integrity of the previously deposited layer when depositing the subsequent layup.

The solvents in the solvent system may be evaporated or removed by any method described in the literature for respective processes and the skilled person will select the best process based on his professional knowledge and experience and the individual situation.

Solvents in the solvent system are preferably evaporated and eliminated by applying reduced pressure or a carrier gas stream or a combination of both. This is particularly preferred if the solvent system to be evaporated comprises a proton acid, which can be eliminated from the gas phase through such procedure.

The concentration of organic compound $M_i$ in the respective solvent system from which it is deposited in the steps of the process of the present invention is not particularly critical. In many cases compounds $M_i$ will be present in a concentration in the range of from 0.05 to 20, preferably from 0.1 to 10 and even more preferably of from 0.2 to 5 wt %, based on the combined weight of solvent system and organic molecule. The maximum concentration of the organic compound in the solvent system is often defined by the solubility of the organic molecule in the solvent system; it is generally preferred to use the organic molecule Mi in a concentration not exceeding the solubility in the respective solvent system to avoid having part of the organic molecule as solid particles in the solvent system as these solid particles may detrimentally influence the processability through solvent based processing techniques.

In the process in accordance with the present invention two or more steps are carried out wherein layers are deposited, which comprise ionizable groups in the same form. The solvent systems for such different deposition steps may be the same or different and are preferably substantially or fully identical.

The liquid compositions in the various deposition steps may comprise, in addition to the solvent systems referred to above and organic compound or compounds $M_i$ additional components like dopants or other additives known to the skilled person for respective liquid compositions to improve or adjust the properties. Generally these components constitute the minor part of the liquid composition, i.e. their percentage, based on the total weight of the liquid composition is less than 50 weight percent.

As mentioned above, the same main organic compound $M_i$ is present in the solvent system of all the steps of the process of the present invention wherein a deposition takes place. Accordingly, the process of the present invention yields at least two adjacent layers with a homojunction: The HOMO and LUMO level of the matrix materials of the at least two adjacent layers are the same after neutralization and drying. Accordingly, the process of the present invention enables to obtain homojunction multilayer structures out of solution, which is an important economical advantage and contributes to improve the performance of the devices based on such multilayer structures.

That process of the present invention may be used for forming at least two layers of a multilayer structure but it is readily apparent to the skilled person that the process may be repeatedly carried out to obtain more than two consecutive layers of a multilayer structure.

In a preferred embodiment all layers of a multilayer structure are obtained by a process in accordance with the present invention thus yielding an ideal homojunction device. Particularly preferred are ambipolar compounds Mi which have both, hole transport and electron transport capability.

A further embodiment of the present invention relates to organic electronic devices having a multilayer structure comprising at least two adjacent layers obtained by the process in accordance with the present invention. Organic electronic devices which can be preferably obtained in accordance with the process of the present invention are transistors, diodes, sensors, memory and photovoltaic devices, and particularly preferably organic light emitting diodes may be obtained in accordance with the process of the present invention.

In accordance with another embodiment of the present invention the organic electronic device comprises a certain residual content of ionizable groups G of compounds Mi in ionized form. Preferably, at least 90 and less than 99.9% based on the total amount of ionizable groups present in the multilayer device are in the neutral form, i.e. 0.1 to less than 10% of the ionizable groups are present in the ionized form in the final device. The amount of ionized groups may be determined by absorption spectroscopy in a manner known to the skilled person.

In a still further embodiment, the organic electronic devices comprise layers comprising compounds Mi having a molecular weight of 2000 Da or higher. Such compounds usually cannot be processed by vapor techniques but may be easily used in the process of the present invention thus yielding respective devices.

What is claimed is:

1. A process for the manufacture of a homojunction multilayer structure suitable for forming part of an organic electronic device having a cathode and an anode, comprising the steps of
   a. depositing a $n^{th}$ layer $L_n$ of the multilayer structure onto a substrate out of a liquid composition $C_n$ comprising a solvent system $S_n$ comprising at least one solvent and at least one organic compound $M_i$ which comprises ionizable groups G which comprise at least one nitrogen atom capable of being reversibly protonated, mainly or totally in neutral ($G_n$) or mainly or totally in ionized ($G_i$) form, wherein the substrate is a previously deposited layer $L_{n-1}$ of the multilayer structure or is an element suitable for forming the cathode or the anode of the organic electronic device, and thereafter either
   b1.1 evaporating the solvent system $S_n$ to form the dry $n^{th}$ layer and, if the organic compound $M_i$ comprises the group G mainly or totally in its ionized form $G_i$, converting partly or completely the groups $G_i$ to the neutral form $G_n$, and
   b1.2 thereafter depositing a $(n+1)^{th}$ layer $L_{n+1}$ of the multilayer structure onto the first layer $L_n$ out of a liquid composition $C_{n+1}$ comprising a solvent system $S_{n+1}$, and organic compound $M_1$ comprising the ionizable group G mainly or totally in ionized form $G_i$ and thereafter
   b1.3. evaporating the solvent system $S_{n+1}$ and converting the groups $G_1$ to form the dry $(n+1)^{th}$ layer mainly or totally to the neutral form $G_n$ or,
   b2.1. evaporating the solvent system $S_n$ to form the dry $n^{th}$ layer $L_n$ comprising groups G mainly or totally in ionized form $G_i$ and thereafter
   b2.2. depositing the $(n+1)^{th}$ layer $L_{n+1}$ of the multilayer structure onto the dry $n^{th}$ layer $L_n$ out of a liquid composition $C_{(n+1)}$, comprising a solvent system $S_{(n+1)}$, comprising organic compound $M_1$ comprising ionizable groups G mainly or totally in the neutral form $G_n$ and evaporating the solvent system $S_{(n+1)}$, to form a dry $(n+1)^{th}$ layer mainly or totally to the neutral form $G_n$ and thereafter either
   b3.1 depositing a $(n+2)^{th}$ layer out of a liquid composition $C_{(n+2)}$ comprising a solvent system $S_{(n+2)}$ comprising organic compound $M_i$ comprising groups G mainly or totally in the ionized form $G_i$ followed by converting the groups $G_i$ in the dry $n^{th}$ and the dry $(n+2)^{th}$ layer mainly or totally to the neutral form, or b3.2 directly converting the groups $G_i$ in the $n^{th}$ layer mainly or totally to the neutral form $G_n$ wherein the solubility of organic compound $M_i$ comprising groups G mainly or totally in ionized form $G_i$ in solvent system $S_{n+1}$ and $S_{n+2}$, different or same, is at least three times as high as the solubility of organic compounds $M_i$ comprising groups G mainly or totally in neutral form $G_n$ in said solvent system $S_{n+1}$ and $S_{n+2}$, and wherein the solubility of organic compounds $M_i$ comprising groups G mainly or totally in neutral form $G_n$ in solvent system $S_{(n+1)}$, is at least three times as high as the solubility of organic compound $M_i$ comprising groups G mainly or totally in ionized form $G_i$ in said solvent system $S_{(n+1)}$, the solubility in all cases determined at 23° C. and atmospheric pressure, wherein the total content of ionizable groups G of compound gin neutral form is at least 90% and less than 99.9%, based on the total amount of ionizable groups G present in the multilayer device, and wherein organic compound $M_i$ comprises a conjugated or non-conjugated polymer having a number average molecular weight of at least 5000 g/mol, and wherein the ionizable groups G, which comprise at least one nitrogen atom capable of being reversibly protonated, of the organic compound $M_i$ are part of the conjugated or non-conjugated polymer main chain.

2. The process of claim 1 wherein organic compound $M_i$ is protonated by one or more acids $H_{ai}A_i^{ai-}$ selected from proton acids having a $pK_a$ of 5.5 or less and a boiling point under atmospheric pressure in the range of from 70 to 160° C. to form salts of general formula $M_i(H^+)_{ni} (A_i^{ai-})_{bi}$ wherein ni represents the number of protons per compound $M_i$, A is a counter anion with negative charge ai and wherein ni=ai×bi.

3. The process of claim 2 wherein ni is less to or equal to the total number of nitrogen atoms in organic compound $M_i$.

4. The process of claim 1 wherein organic compound $M_i$ comprises at least one group G selected from 5- or 6-membered heterocyclic rings comprising at least one nitrogen atom, arylamine and carbazole derivatives.

5. The process of claim 1 wherein the groups G are selected from pyrrole, pyrazole, imidazole, oxazole, oxadiazole, triazole, indole, iso-indole, pyridine, pyridazine, pyrimidine, pyrazine, triazine, tetrazine, quinoline, iso-quinoline and phenanthroline.

6. The process of claim 1 wherein the solvent system for organic compound M comprising groups G mainly or totally in ionized form $G_i$ comprises at least one proton acid $H_{ai}A_i^{ai}$, water and/or a $C_1$-$C_3$ alcohol or mixtures thereof.

7. The process of claim 6 wherein the proton acids $H_{ai}A_i^{ai}$ are carboxylic acids, preferably selected from formic acid, acetic acid, 2-propenoic acid, 2-propynoic acid, lactic acid, maleic acid, trifluoroacetic acid, trifluoropropanoic acid, trifluorobutanoic acid and mixtures thereof.

8. The process of claim 1 wherein the conversion of groups G in ionized form $G_i$ to the neutral form $G_n$ is achieved by subjecting the layer comprising the groups $G_i$ to elevated temperatures up to a maximum of 180° C.

9. The process of claim 2 wherein the proton acids are evaporated and eliminated from the gas phase by applying reduced pressure or a carrier gas stream or a combination of both.

10. An organic electronic device
which is prepared by a process comprising a process for the manufacture of a homojunction multilayer structure suitable for forming part of the organic electronic device having a cathode and an anode, comprising the steps of a. depositing a $n^{th}$ layer $L_n$ of the multilayer structure onto a substrate out of a liquid composition $C_n$ comprising a solvent system $S_n$ comprising at least one solvent and at least one organic compound $M_i$ which comprises ionizable groups G which comprise at least one nitrogen atom capable of being reversibly protonated, mainly or totally in neutral ($G_n$) or mainly or totally in ionized ($G_i$) form, wherein the substrate is a previously deposited layer $L_{n-1}$ of the multilayer structure or is an element suitable for forming the cathode or the anode of the organic electronic device, and thereafter either b1.1 evaporating the solvent system $S_n$ to form the dry $n^{th}$ layer and, if the organic compound $M_i$ comprises the group G mainly or totally in its ionized form $G_i$, converting partly or completely the groups $G_i$ to the neutral form $G_n$, and b1.2 thereafter depositing a $(n+1)^{th}$ layer $L_{n+1}$ of the multilayer structure onto the first layer $L_n$ out of a liquid composition $C_{n+1}$ comprising a solvent system $S_{n+1}$, and organic compound $M_i$ comprising the ionizable group G mainly or totally in ionized form $G_i$ and thereafter b1.3. evaporating the solvent system $S_{n+1}$ and converting the groups $G_i$ to form the dry $(n+1)^{th}$ layer mainly or totally to the neutral form $G_n$ or, b2.1. evaporating the solvent system $S_n$ to form the dry $n^{th}$ layer $L_n$ comprising groups G mainly or totally in ionized form $G_i$ and thereafter b2.2. depositing the $(n+1)^{th}$ layer $L_{n+1}$ of the multilayer structure onto the dry $n^{th}$ layer $L_n$ out of a liquid composition $C_{(n+1)}$, comprising a solvent system $S_{(n+1)}$, comprising organic compound $M_i$ comprising ionizable groups G mainly or totally in the neutral form $G_n$ and evaporating the solvent system $S_{(n+1)}$, to form a dry $(n+1)^{th}$ layer mainly or totally to the neutral form $G_n$ and thereafter either b3.1 depositing a $(n+2)^{th}$ layer out of a liquid composition $C_{(n+2)}$ comprising a solvent system $S_{(n+2)}$ comprising organic compound $M_i$ comprising groups G mainly or totally in the ionized form $G_i$ followed by converting the groups $G_i$ in the dry $n^{th}$ and the dry $(n+2)^{th}$ layer mainly or totally to the neutral form, or b3.2 directly converting the groups $G_i$ in the $n^{th}$ layer mainly or totally to the neutral form $G_n$ wherein the solubility of organic compound $M_i$ comprising groups G mainly or totally in ionized form $G_i$ in solvent system $S_{n+1}$ and $S_{n+2}$, different or same, is at least three times as high as the solubility of organic compounds $M_i$ comprising groups G mainly or totally in neutral form $G_n$ in said solvent system $S_{n+1}$ and $S_{n+2}$, and wherein the solubility of organic compounds $M_i$ comprising groups G mainly or totally in neutral form $G_n$ in solvent system $S_{(n+1)}$, is at least three times as high as the solubility of organic compound $M_i$ comprising groups G mainly or totally in ionized form $G_i$ in said solvent system $S_{(n+1)}$, the solubility in all cases determined at 23° C. and atmospheric pressure, wherein the total content of ionizable groups G of compound gin neutral form is at least 90% and less than 99.9%, based on the total amount of ionizable groups G present in the multilayer device, and wherein organic compound $M_i$ comprises a conjugated or non-conjugated polymer having a number average molecular weight of at least 5000 g/mol, and wherein the ionizable groups G, which comprise at least one nitrogen atom capable of being reversibly protonated, of the organic compound $M_i$ are part of the conjugated or non-conjugated polymer main chain.

11. The organic electronic device of claim 10 which is a transistor, a diode or a photovoltaic device.

12. The organic electronic device in accordance with claim 11 which is an organic light emitting diode (OLED).

13. The organic electronic device in accordance with claim 10, wherein organic compound $M_i$ is protonated by one or more acids $H_{ai}A_i^{ai-}$ selected from proton acids having a p$K_a$ of 5.5 or less and a boiling point under atmospheric pressure in the range of from 70 to 160° C. to form salts of general formula $M_i(H^+)_{ni}(A_i^{ai-})_{bi}$ wherein ni represents the number of protons per compound $M_i$, A is a counter anion with negative charge ai and wherein ni=ai×bi.

14. The organic electronic device in accordance with claim 10, wherein organic compound $M_i$ comprises at least one group G selected from 5- or 6-membered heterocyclic rings comprising at least one nitrogen atom, arylamine and carbazole derivatives.

15. The organic electronic device in accordance with claim 10, wherein the groups G are selected from pyrrole, pyrazole, imidazole, oxazole, oxadiazole, triazole, indole, iso-indole, pyridine, pyridazine, pyrimidine, pyrazine, triazine, tetrazine, quinoline, iso-quinoline and phenanthroline.

* * * * *